United States Patent
Hwang

(10) Patent No.: US 10,134,839 B2
(45) Date of Patent: Nov. 20, 2018

(54) FIELD EFFECT TRANSISTOR STRUCTURE HAVING NOTCHED MESA

(71) Applicant: Raytheon Company, Waltham, MA (US)

(72) Inventor: Kiuchul Hwang, Amherst, NH (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/707,435

(22) Filed: May 8, 2015

(65) Prior Publication Data

US 2016/0329420 A1    Nov. 10, 2016

(51) Int. Cl.
H01L 29/06 (2006.01)
H01L 29/812 (2006.01)
(Continued)

(52) U.S. Cl.
CPC ........ *H01L 29/0657* (2013.01); *H01L 29/812* (2013.01); *H01L 29/2003* (2013.01); *H01L 29/4175* (2013.01); *H01L 29/41758* (2013.01)

(58) Field of Classification Search
CPC ............. H01L 27/0629; H01L 29/7787; H01L 29/2003; H01L 29/205; H01L 29/42316;
(Continued)

(56) References Cited

U.S. PATENT DOCUMENTS 3,813,585 A * 5/1974 Tarui ................. H01L 21/30617
148/DIG. 115

4,219,835 A * 8/1980 van Loon ........... H01L 29/7813
148/DIG. 28
(Continued)

FOREIGN PATENT DOCUMENTS

| EP | 0 837 510 A2 | 4/1998 |
| EP | 0 837 510 A3 | 7/1999 |
| JP | 10261651 A * | 9/1998 |

OTHER PUBLICATIONS

Notification of Transmittal of the International Search Report and the Written Opinion of the International Searching Authority, or the Declaration, PCT/US2016/030868, dated Jul. 15, 2016, 1 page.
(Continued)

*Primary Examiner* — Mohammed Shamsuzzaman
(74) *Attorney, Agent, or Firm* — Daly, Crowley, Mofford & Durkee, LLP

(57) ABSTRACT

A Field Effect Transistor structure is provided having: a semi-insulating substrate; a semiconductor mesa structure disposed on the substrate and having a notch in an outer sidewall of the mesa structure; a source electrode disposed within the opposing sidewalls in ohmic contact with a source region of the mesa structure; a drain electrode disposed within the opposing sidewalls in ohmic contact with a drain region of the mesa; and a gate electrode, having an inner portion disposed between, and laterally of, the source electrode and the drain electrode and in Schottky contact with the mesa structure, extending longitudinally towards the notch and having outer portions extending beyond the mesa structure and over portions of the substrate outside of the mesa structure. In one embodiment, the mesa structure includes a pair of notches projecting inwardly towards each other and the inner portion of the gate extends longitudinally between the pair of notches.

19 Claims, 6 Drawing Sheets

(51) Int. Cl.
*H01L 29/20* (2006.01)
*H01L 29/417* (2006.01)

(58) Field of Classification Search
CPC ............... H01L 29/475; H01L 21/0237; H01L 21/02439; H01L 21/02521; H01L 29/12; H01L 31/0256; H01L 33/26
USPC ........... 257/76, 330, 409, 277, 275; 438/597
See application file for complete search history.

(56) References Cited

U.S. PATENT DOCUMENTS

| | | | | |
|---|---|---|---|---|
| 4,317,125 | A * | 2/1982 | Hughes | H01L 21/30612 257/275 |
| 4,321,613 | A * | 3/1982 | Hughes | H01L 21/30612 148/DIG. 84 |
| 4,632,710 | A * | 12/1986 | Van Rees | H01L 21/02395 117/89 |
| 4,974,039 | A | 11/1990 | Schindler et al. | |
| 5,025,296 | A * | 6/1991 | Fullerton | H01L 23/4821 257/275 |
| 5,270,554 | A * | 12/1993 | Palmour | H01L 29/1608 257/280 |
| 5,358,878 | A * | 10/1994 | Suchet | H01L 21/7605 257/E21.407 |
| 5,364,816 | A * | 11/1994 | Boos | H01L 29/42316 257/276 |
| 5,483,089 | A * | 1/1996 | Terazono | H01L 21/7605 257/192 |
| 5,689,124 | A * | 11/1997 | Morikawa | H01L 29/1075 257/183 |
| 6,081,006 | A * | 6/2000 | Nelson | H01L 23/481 257/276 |
| 6,545,543 | B2 * | 4/2003 | Nelson | H01L 27/088 257/341 |
| 6,774,416 | B2 * | 8/2004 | Nelson | H01L 27/088 257/275 |
| 7,112,478 | B2 | 9/2006 | Grupp et al. | |
| 2002/0014670 | A1 * | 2/2002 | Litwin | H01L 29/0692 257/401 |
| 2006/0084232 | A1 * | 4/2006 | Grupp | H01L 29/0895 438/291 |
| 2007/0111435 | A1 | 5/2007 | Kim et al. | |
| 2009/0090934 | A1 | 4/2009 | Tezuka et al. | |

OTHER PUBLICATIONS

International Search report, PCT/US2016/030868, dated Jul. 15, 2016, 4 pages.
Written Opinion of the International Searching Authority, PCT/US2016/030868, dated Jul. 15, 2016, 6 pages.
Notification Concerning Transmittal of International Preliminary Report on Patentability (Chapter I of the Patent Cooperation Treaty), PCT/US2016/030868, dated Nov. 23, 2017, 1 page.
International Preliminary Report on Patentability, PCT/US2016/030868, dated Nov. 14, 2017, 1 page.
Written Opinion of the International Searching Authority, PCT/US2016/030868, dated Nov. 14, 2017, 6 pages.
Tsui et al, A Novel 25-nm Modified Schottky-Barrier FinFET With High Performance, IEEE Electron Letters, vol. 25, No. 6, 2004. pp. 430-432.

* cited by examiner

FIELD EFFECT TRANSISTOR STRUCTURE HAVING NOTCHED MESA

TECHNICAL FIELD

This disclosure relates generally to Field Effect Transistor (FET) Structures and more particularly to FET structures having reduced gate parasitics.

BACKGROUND

As is known in the art, as the frequency of FET (Field Effect Transistor) operation goes above 90 GHz toward THz range, both gate and channel lengths of FETs are reduced to sub-80 nm range towards 20 nm according to recent publications. At these small geometries, parasitic resistance, inductance, and capacitance of the FETs significantly affect the RF performance of the FET device, such as power, gain and efficiency. Most of attempts to increase the operating frequency of FET have focused on using smaller gate length and width, and narrow channel.

More particularly, a FET according to the PRIOR ART is shown in FIGS. 1A-1C. Here, a semi-insulating, highly resistive, substrate, such as SiC, has formed on the upper surface thereof a mesa shaped semiconductor structure, here for example a Group III-V structure, here, for example, a GaN structure. More particularly, III-V based structures such as GaN-based transistors use electrons formed between two different bandgap materials, for example, AlGaN and GaN. Formed in ohmic contact with source and drain regions of the upper surface of the mesa are source and drain electrodes, as shown. Disposed between the source and drain electrodes is a gate electrode in Schottky contact with an upper surface of the mesa (a gate region) disposed between the source and drain regions. The gate electrode is used to control a flow of carriers (holes and electrons) in an active region of the mesa though the active region (sometimes herein referred to as the gate channel region) between the source and drain regions. It is noted that the regions outside of the mesa area, called 'off mesa area'. The off mesa area, as noted above, is semi-insulating highly resistive area. The Effective gate width (the active region) is the length of the gate electrode is the region closest to the source and drain regions (the gate channel region) and it is this gate channel region that contributes to the conduction of transistor. As the gate channel width (the distance between the source and drain) gets narrower to reduce the electron transfer time for high frequency operation, the contribution of the carriers in the gate channel region gets stronger. From the prior art it is noted that the total gate length extends beyond the gate channel length even though the most of carrier conduction occurs along the gate channel length; however, the portions of the gate electrode extending beyond the gate channel region generate parasitic gate resistance, inductance, and capacitance and thereby contribute negatively for high frequency operation.

Next, it is noted that the source electrode is disposed within opposing sidewalls of the mesa structure, the drain electrode is disposed within the opposing sidewalls in ohmic contact with a drain region of the mesa, and the gate electrode is disposed within opposing walls of the gate region of the mesa and that the mesa is rectangular shape. Further, it is noted that the source electrode has an inner edge extending between ends SOURCE EDGE 1, SOURCE is EDGE 2 (FIG. 1A) thereof proximate the gate electrode that extends along a direction parallel to the gate electrode; and, likewise the drain electrode has an inner edge extending between ends DRAIN EDGE 1, DRAIN EDGE 2 (FIG. 1) thereof proximate the gate electrode that extends along a direction parallel to the gate electrode. The lengths of the inner edges of the source and drain electrodes are equal. The gate electrode extends beyond the ends of SOURCE EDGE 1, SOURCE EDGE 2 of the inner edge of the source electrode and thus also beyond the ends of DRAIN EDGE 1, DRAIN EDGE 2 of the inner edge of the drain electrode. The active region (gate channel) extends between ends DRAIN EDGE 1 (or SOURCE EDGE 1) and DRAIN EDGE 2 (or SOURCE EDGE 2) (FIG. 1A). As noted above, the total gate electrode length extends beyond the active region (gate channel length), even though the most of carrier conduction occurs along the gate channel length, generates unwanted parasitic gate resistance, inductance, and capacitance and thereby contributes negatively for high frequency operation of the FET.

SUMMARY

In accordance with the present disclosure, a Field Effect Transistor structure is provided having: a semi-insulating substrate; a semiconductor mesa structure disposed on the substrate and having a notch in an outer sidewall of the mesa structure; a source electrode disposed within the opposing sidewalls in ohmic contact with a source region of the mesa structure; a drain electrode disposed within the opposing sidewalls in ohmic contact with a drain region of the mesa structure; and a gate electrode, having an inner portion disposed between, and laterally of, the source electrode and the drain electrode and in Schottky contact with the mesa structure, extending longitudinally towards the notch and having outer portions extending beyond the mesa structure and over portions of the substrate outside of the mesa structure.

In one embodiment, the mesa structure includes a pair of notches project inwardly towards each other and the inner portion of the gate extends longitudinally between the pair of notches.

With such an arrangement, the gate parasitics of the prior art are reduced by the formation of the notches in the mesa structure because extra gate length on top of the active region of the mesa structure is eliminated and the gate tab (or pad) disposed on the substrate off of the mesa structure is able to be positioned closer to active inner portion of the gate. With a multi-fingered gate structure, as the number of gate fingers increases, the parasitic components are multiplied and therefore the disclosed. FET structure significantly improves the performance of FETs with multiple gate fingers at high operating frequency.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
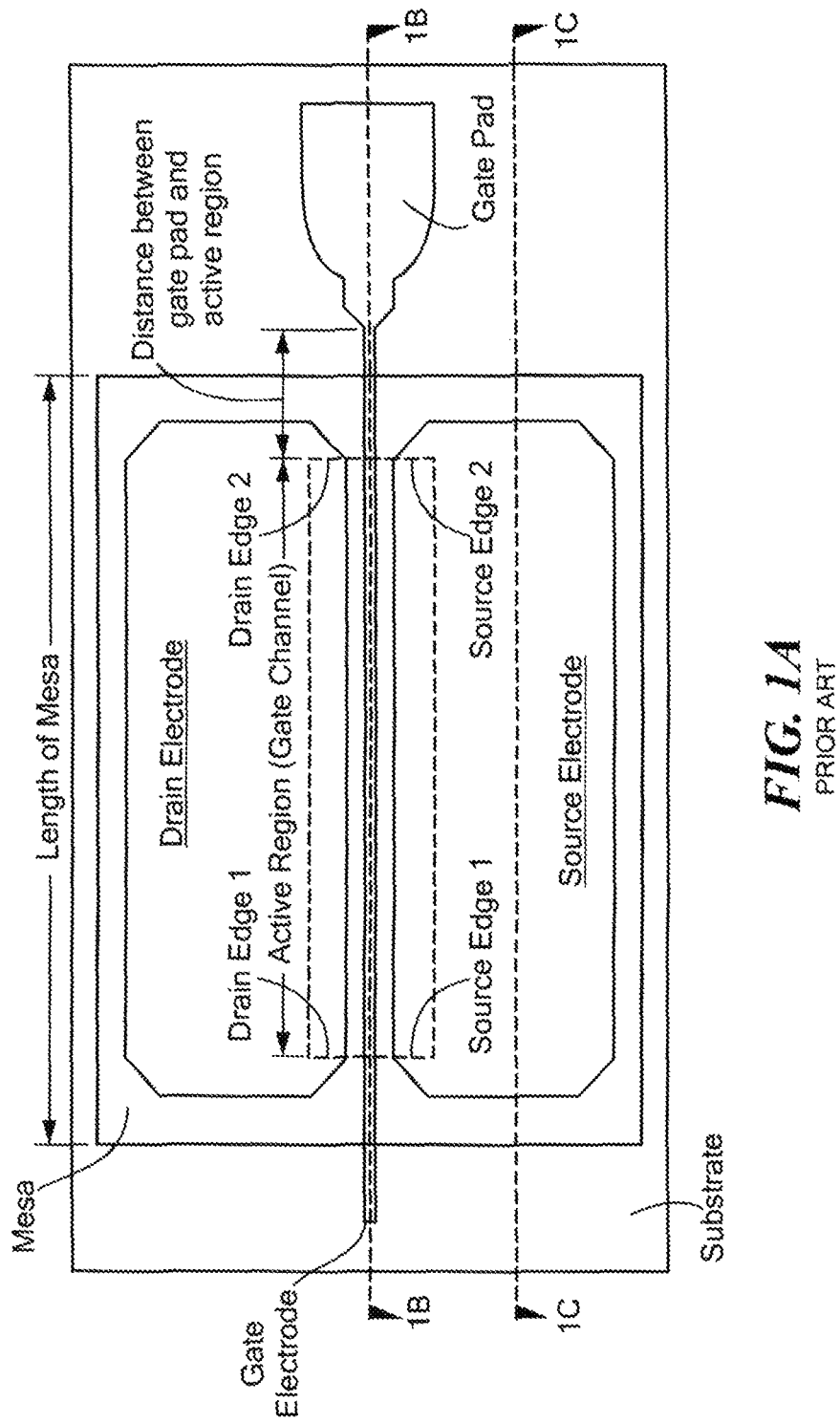
FIGS. 1A-1C are plan, and cross sectional views of a Field Effect Transistor structure according to the PRIOR ART, where the cross sectional views in FIGS. 1B and 1C are taken along lines 1B-1B and 1C-1C, respectively, in FIG. 1A.
Figure 1B:
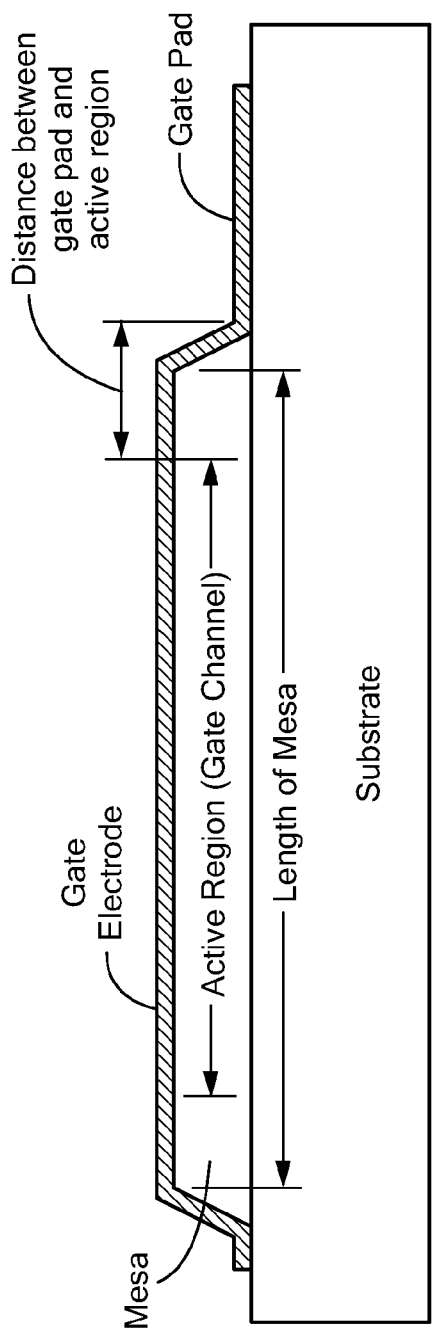
Figure 1C:
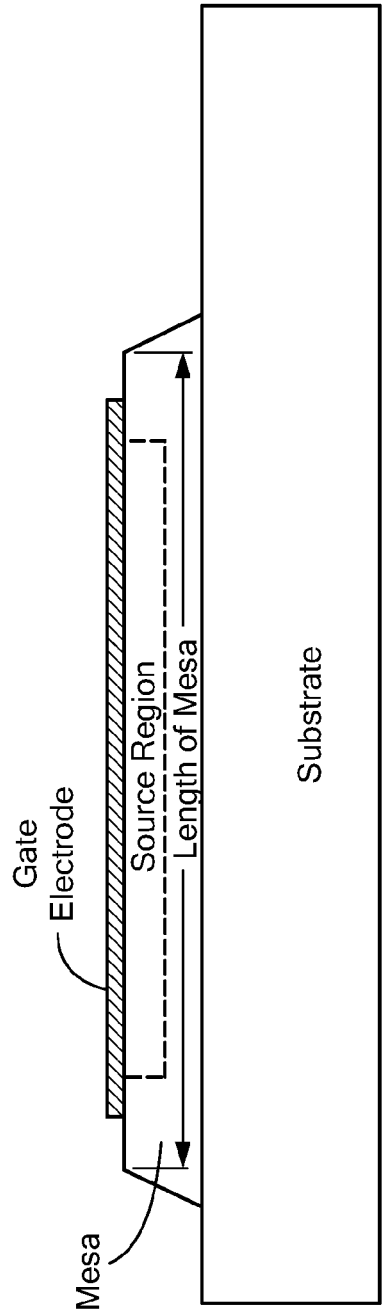
Figure 2A:
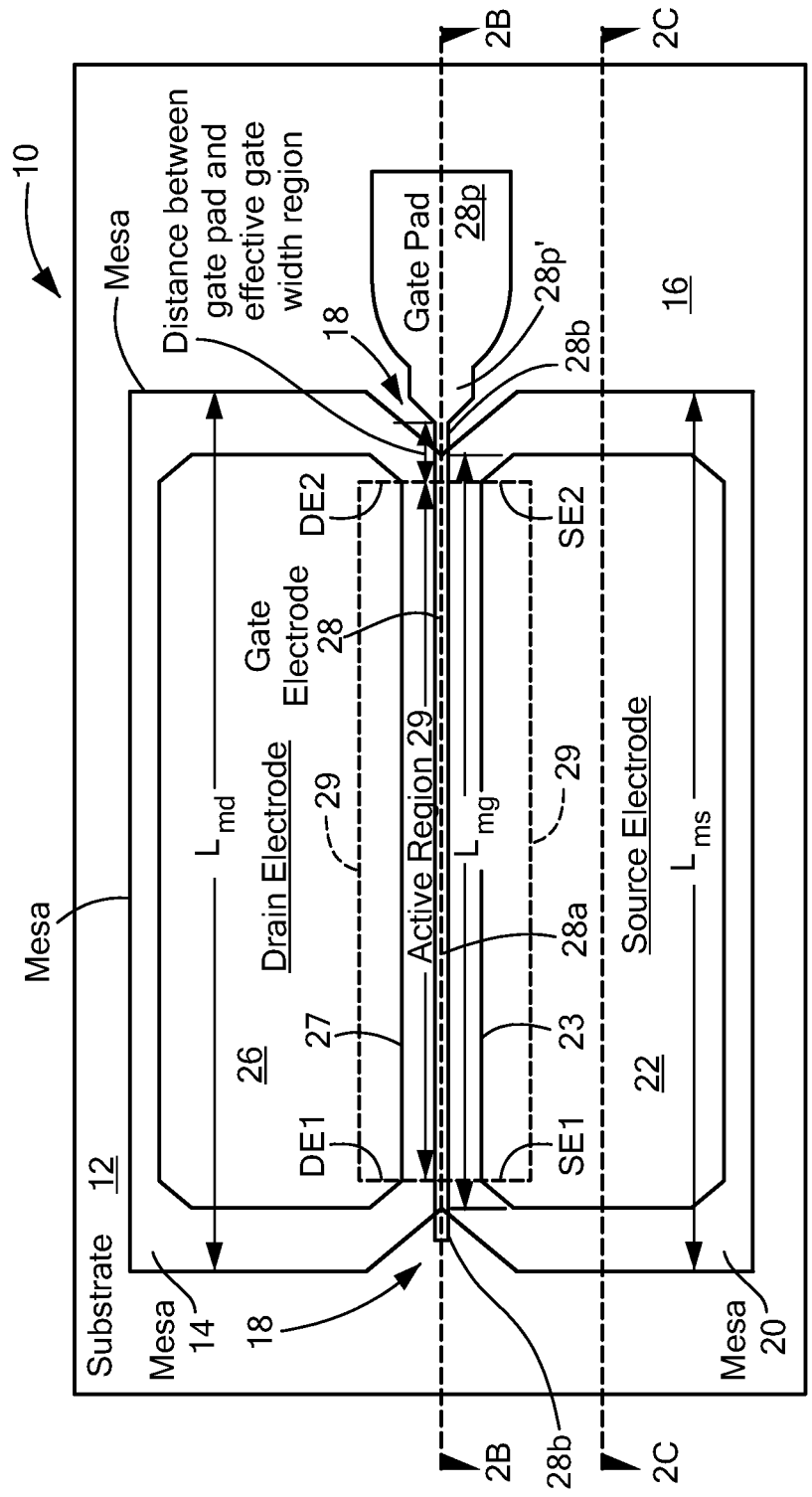
FIGS. 2A-2B are plan, and cross sectional views of a Field Effect Transistor structure according to the disclosure, where the cross sectional views in FIGS. 2B and 2C are taken along lines 2B-2B and 2C-2C, respectively, in FIG. 2A.
Figure 2B:
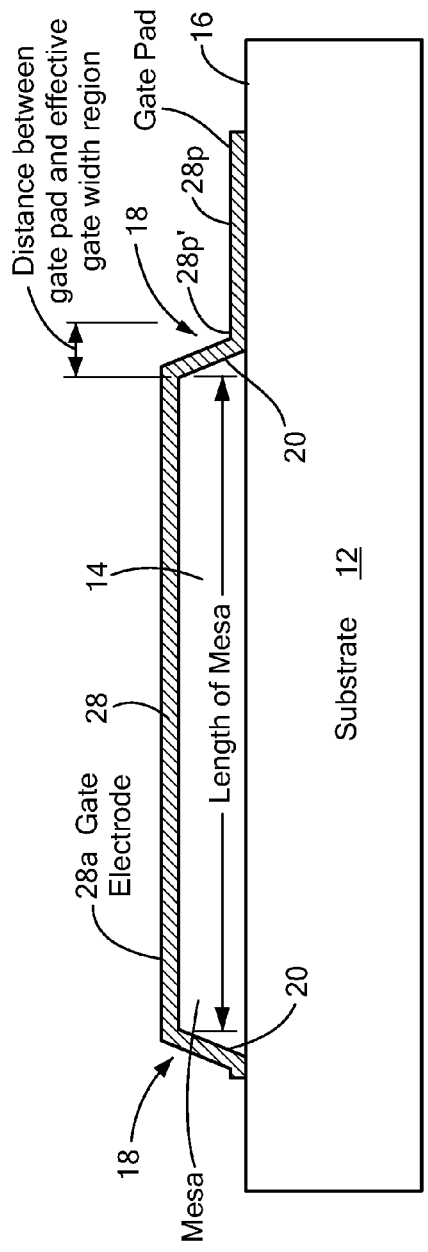
Figure 2C:
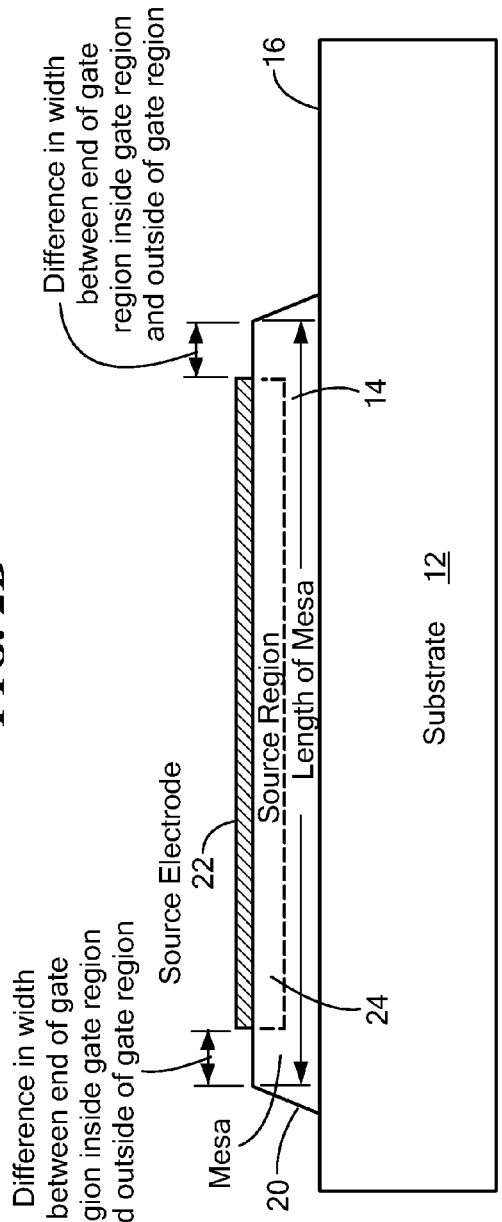

Referring now to FIGS. 2A-2C, a Field Effect Transistor structure 10 is shown having: a semi-insulating substrate 12, here for example, a semi-insulating, highly resistive, substrate, such as SiC, GaAs, and InP; a semiconductor mesa structure 14, here for example, a Group III-V structure such as a GaN structure, disposed on the upper surface 16 of the substrate 12 and having a pair of notches 18 in opposing outer sidewalls 20 of the mesa structure 14; a source electrode 22 disposed within the opposing sidewalls 20 in ohmic contact with a source region 24 (FIG. 2C) of the mesa structure 14 under the source electrode 22; a drain electrode 26 disposed within the opposing sidewalls 20 in ohmic contact with a drain region (not shown) under the drain electrode 26 of the mesa structure 14; and a gate electrode 28, having an inner portion 28a disposed between, and laterally of, the source electrode 22 and the drain electrode 26 and in Schottky contact with the portion of the mesa structure 14 under the inner portion of the gate electrode 28a, extending longitudinally between the pair of notches 18 and having outer portions 28b extending beyond the mesa structure 14 and over portions of the upper surface 16 of substrate 12 outside of the mesa structure 14 ("off-mesa"). Thus, here the mesa structure 14 includes a pair of notches 18 which project inwardly towards each other and the inner portion 28a of the gate 28 extends longitudinally between the pair of notches 18. It is noted that here the notches 18 are v-shaped notches. It should be understood, however, that the notches 18 may be of a different shapes and includes, for example, any shaped indentation or groove in the sidewalls 20 of the mesa structure 14, including, for example, a rounded indentation, a square or rectangular indentation.

Further, it is noted that the source electrode 22 has an inner edge 23 extending between ends SE 1 and SE2 (FIG. 2A) thereof proximate the inner portion 28a of gate electrode 28; and, likewise the drain electrode 26 has an inner edge 27 extending between ends DE1, DE2 (FIG. 2A) thereof proximate the inner portion 28a of gate electrode 28. Here, the lengths of the inner edges 23, 27 of the source and drain electrodes 22, 26 are equal. The gate electrode 28 extends beyond the ends SE1, SE2 of the inner edge 23 of the source electrode 22 and thus also beyond the ends DE1, DE2 of the inner edge 27 of the drain electrode 26. The active region (gate channel) 29 in under the inner portion 28a of the gate electrode 28 and extends between ends DE1 (or SE1) and DE2 (or SE2) (FIG. 2A).

It is noted that the inner portion 28a of the gate electrode 28 is elongated and the source electrode 22 and the drain electrode 26 are here also elongated along directions parallel to the direction of the elongated inner portion 28a of the gate electrode 28. It is also noted that the source electrode 22 is within opposing outer portions of the sidewalls 20 of the mesa structure. 14 separated a length $L_{ms}$ measured along the top surface of the mesa; the drain electrode is within opposing portions of the sidewalls 20 separated a length $L_{md}$ measured along the top surface of the mesa; and the inner portion 28a of the gate electrode 28 is within the pair of notches 18, the notches being separated a length $L_{mg}$ measured along the top surface of the mesa; where $L_{mg}$ is less than either one of the lengths $L_{md}$ or $L_{ms}$; it here being noted that length $L_{md}$ equals length $L_{ms}$. It is noted that all three lengths are measured along directions parallel to the direction of the elongated inner portion 28a of the gate electrode 28. One end of the inner portion 28a of the gate electrode 28 terminates in a gate pad 28p and a portion 28p' of the gate pad 28p is disposed within a portion of one of the pair of notches 18, here the notch 28 on the right hand side of mesa structure 14 in FIG. 2A. The gate pad 28p is wider than the inner region 28a of the gate electrode 28.

Figure 3:
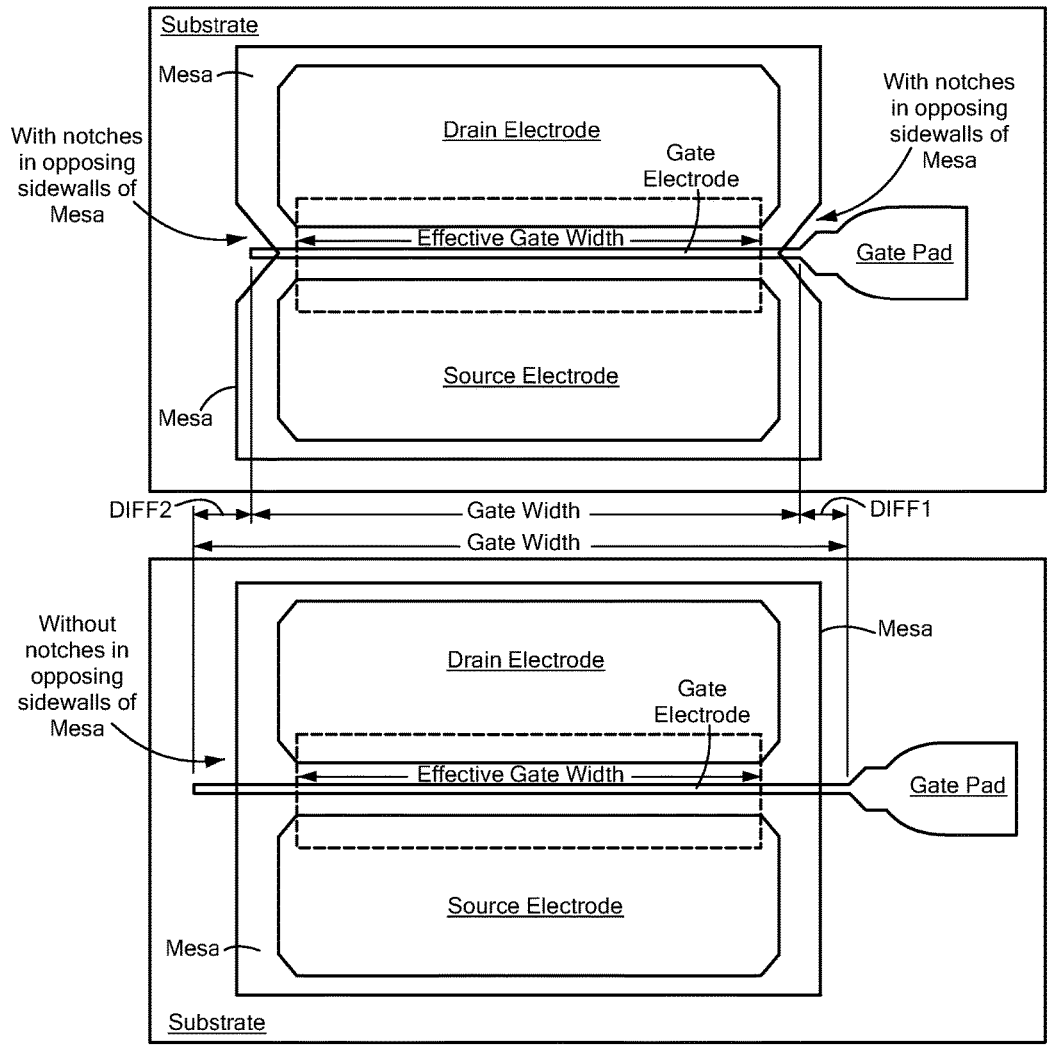
FIG. 3 is a plan view of the Field Effect Transistor structure of FIG. 1A disposed in a side-by-side relationship with the Field Effect Transistor structure of FIG. 2B to compare the two Field Effect Transistor structures.

Referring now to FIG. 3, a comparison is shown between the plan view of a mesa structure with a pair of opposing notches (the upper portion of FIG. 3) and a mesa structure without a pair of opposing notches (the lower portion of FIG. 3). It is noted that the length of the gate electrode between the end of the active gate region and the gate pad on the right hand side of FIG. 3 with the notch is less than the length of the gate electrode between the end of the active gate region and the gate pad without the notch by a difference in length DIFF1. Similarly, it is noted that the length of the gate electrode between the end of the active gate region and the left hand end of the gate electrode with the notch is less than the length of the gate electrode between the end of the active gate region and the left hand end of the gate electrode without the notch by a difference in length DIFF2. Thus, the gate parasitics are reduced by the formation of the notches in the mesa structure because extra gate length on top of the active region of the mesa structure is eliminated and the gate tab (or pad) disposed on the substrate off of the mesa structure is able to be positioned closer to active inner portion of the gate.

Figure 4:
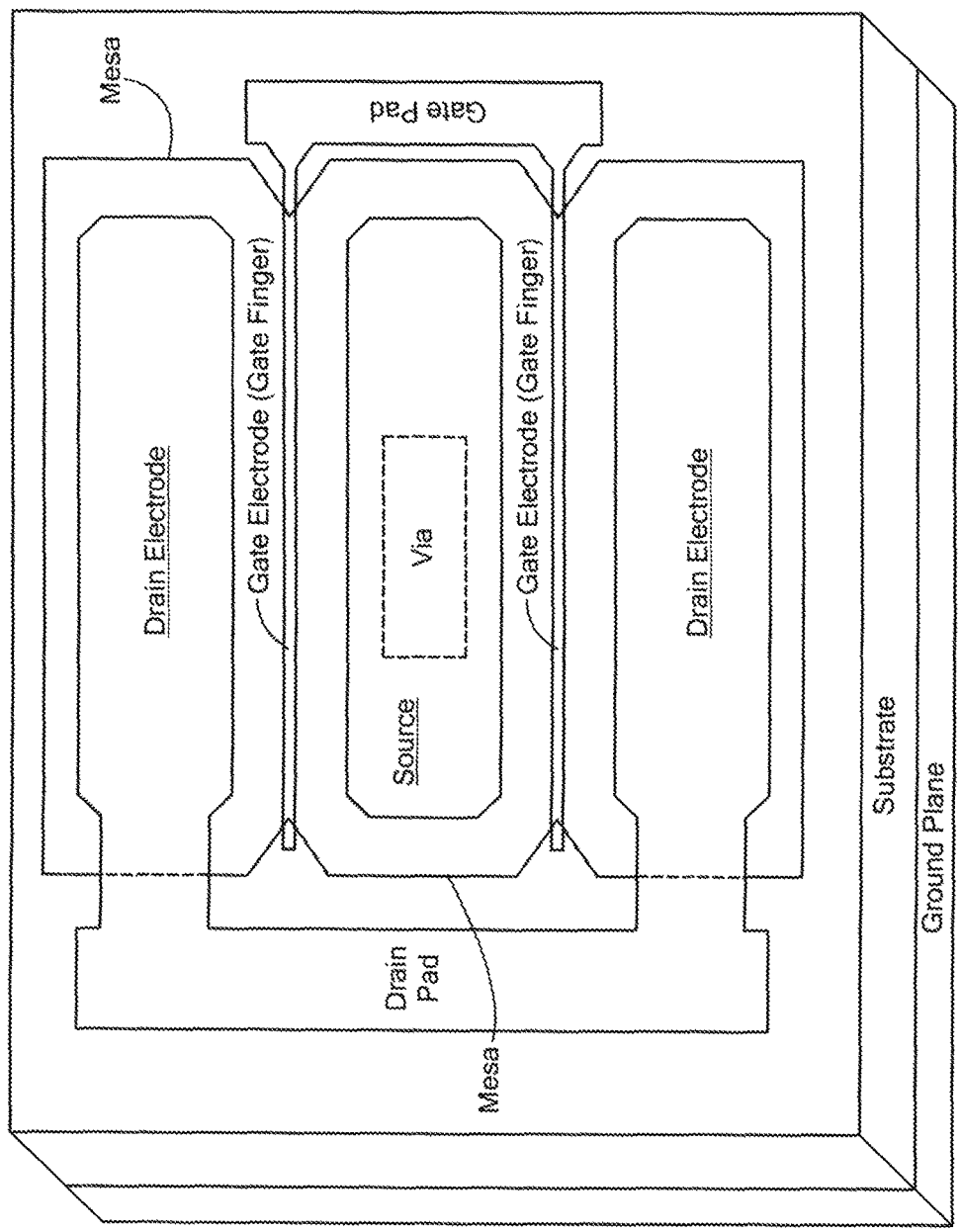
FIG. 4 is a plan view of a multi-gate embodiment of a Field Effect Transistor structure according to the disclosure.

Referring now to FIG. 4, a multi-fingered gate structure, here having two gate fingers, it being understood that more than two gate fingers may be used, of the FET of FIGS. 2A-2C is shown. Here, the source electrode is connected to a ground plane on the bottom surface of the substrate with a conductive via passing vertically through the mesa structure and the underlying portion of the substrate. It is noted that as the number of gate fingers increases, the parasitic components are multiplied and therefore the disclosed FET structure significantly improves the performance of FETs with multiple gate fingers.

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A Field Effect Transistor structure, comprising:
a substrate;
a Group III-V semiconductor mesa structure disposed on a first portion of a surface of the substrate, the Group III-V semiconductor mesa structure having a notch projecting into an outer sidewall of the Group III-V semiconductor mesa structure, the notch being disposed over, and exposing, a second portion of the surface of the substrate outside the Group III-V semiconductor mesa structure;
a source electrode in ohmic contact with a source region formed with a surface of the Group III-V semiconductor mesa structure;

a drain electrode in ohmic contact with a drain region formed with the surface of the Group III-V semiconductor mesa structure;

a gate electrode having an inner portion connected to a and an outer portion structure wider than the inner portion, the inner portion being in Schottky contact with an active region in the surface of the Group III-V semiconductor mesa structure and disposed between the source region and the drain region, the inner portion of the gate electrode extending along a direction parallel to the surface of the substrate towards the notch, a portion of the structure wider than the inner portion being disposed on the exposed second portion of the surface of the substrate, the portion of the structure wider than the inner portion disposed on the exposed second portion of the surface of the substrate being narrower than, and spaced from opposing sides of the notch;

wherein the structure wider than the inner portion comprises a gate pad, a portion of the gate pad being disposed within a portion of the notch and another portion of the gate pad wider than the portion of the gate pad is disposed outside the notch.

2. The Field Effect Transistor structure recited in claim 1 wherein the Group III-V semiconductor mesa structure has a second notch, the second notch exposing a third portion of the surface of the substrate outside of the outer sidewall of the Group III-V semiconductor mesa structure to provide a pair of inwardly projecting, opposing notches and wherein the active region is disposed between the pair of opposing notches.

3. The Field Effect Transistor structure recited in claim 1 wherein:

the source electrode is disposed within opposing outer sidewalls of the Group III-V semiconductor mesa structure separated by a length $L_{ms}$ measured along a top surface of the mesa structure;

the drain electrode is disposed within opposing outer sidewalls of the Group III-V semiconductor mesa structure separated by a length $L_{md}$ measured along the top surface of the Group semiconductor mesa structure;

wherein the outer sidewall of the Group III-V semiconductor mesa structure having the notch and another outer sidewall, opposing the outer sidewall having the notch, are separated by a length $L_{mg}$ measured along the top surface of the Group III-V semiconductor mesa structure; where $L_{mg}$ is less than either $L_{md}$ or $L_{ms}$.

4. The Field Effect Transistor structure recited in claim 2 wherein:

the source electrode is disposed within opposing outer sidewalls of the Group III-V semiconductor mesa structure separated by a length $L_{ms}$;

the drain electrode is disposed within the opposing outer sidewalls of the Group III-V semiconductor mesa structure separated by a length $L_{md}$; and wherein the pair of opposing notches are separated by a length $L_{mg}$; where $L_{mg}$ is less than either $L_{md}$ or $L_{ms}$.

5. A Field Effect Transistor structure, comprising:

a substrate;

a Group III-V semiconductor mesa structure disposed on a top surface of the substrate;

a source electrode in ohmic contact with a source region of the Group III-V semiconductor mesa structure and being disposed within opposing sidewalls of a source electrode portion of the Group III-V semiconductor mesa structure, the opposing sidewalls of the source electrode portion of the Group III-V semiconductor mesa structure being separated by a length Lms measured along a top surface of the Group III-V semiconductor mesa structure;

a drain electrode in ohmic contact with a drain region of the Group III-V semiconductor mesa structure and being disposed within opposing sidewalls of a drain electrode portion of the Group III-V semiconductor mesa structure, the opposing side walls of the drain electrode portion of the Group III-V semiconductor mesa structure being separated by a length Lmd measured along the top surface of the Group III-V semiconductor mesa structure;

a gate electrode, having:

an inner portion disposed between the source electrode and the drain electrode and in Schottky contact with the Group III-V semiconductor mesa structure, the gate electrode extending longitudinally across the Group III-V semiconductor mesa structure, the inner portion of the gate electrode being disposed within opposing sidewalls of a gate electrode portion of the Group III-V semiconductor mesa structure, the gate electrode portion of the Group III-V semiconductor mesa structure having a separation a length Lmg measured along the top surface of the Group III-V semiconductor mesa structure; where Lmg is less than either Lmd or Lms; and wherein the inner portion is connected to a structure wider than the inner portion and;

wherein one of the opposing sidewalls of the gate electrode portion of the Group III-V semiconductor mesa structure has a notch therein projecting into said one of the opposing sidewalls of the gate electrode portion of the Group III-V semiconductor mesa structure, the notch exposing a portion of the substrate outside of the Group III-V semiconductor mesa structure; and wherein the gate electrode extends beyond the said one of the opposing sidewalls of Group III-V semiconductor mesa structure, a portion of the structure wider than the inner portion being disposed on the portion of the substrate outside of the Group III-V semiconductor mesa structure exposed by the notch, the portion of the structure wider than the inner portion being disposed on the portion of the substrate outside of the Group III-V semiconductor mesa structure exposed by the notch being narrower than, and spaced from opposing sides of the notch; and wherein the structure wider than the inner portion comprises a gate pad, a portion of the gate pad being disposed within a portion of the notch and another portion of the gate pad wider than the portion of the gate pad is disposed outside the notch.

6. A Field Effect Transistor structure, comprising:

a substrate having: a Group III-V structure on a portion of the substrate; and a region outside of the Group III-V structures, the Group III-V structure having a notch projecting into one of a pair of opposing sides of the Group III-V structure, the notch exposing a portion of the region outside of the Group III-V structure:

a source electrode disposed on a surface of the Group III-V structure within the pair of opposing sides of the Group III-V structure, the source electrode being in ohmic contact with a source region of the Group III-V structure:

a drain electrode disposed on the surface of the Group III-V structure within the pair of opposing sides of the Group III-V structure, the drain electrode being in ohmic contact with a drain region of the Group III-V structure:
a gate electrode, having an inner portion disposed in Schottky with an active region in the Group III-V structure between the source electrode and the drain electrode, the inner portion being connected to a structure wider than the inner portion, a portion of the structure wider than the inner portion being disposed on the region outside of the Group III-V structure exposed by the notch, the portion of the structure wider than the inner portion disposed on the region outside of the Group III-V structure exposed by the notch being narrower than, and spaced from sides of the notch;
wherein the notch extends along a direction parallel to the surface of the substrate and towards the active region;
wherein the structure wider than the inner portion comprises a gate pad, a portion of the gate pad being disposed within a portion of the notch and another portion of the gate pad wider than the portion of the gate pad is disposed outside the notch.

7. The Field Effect Transistor structure recited in claim 6 wherein the Group III-V structure has an additional notch projecting into a second one of the pair of opposing sides of the Group III-V structure to provide a pair of opposing notches projecting inwardly towards each other and wherein the inner portion of the gate electrode extends longitudinally between the pair of opposing notches.

8. The Field Effect Transistor structure recited in claim 6 wherein:
the source electrode is disposed on the Group III-V structure having opposing sides separated by a length $L_{ms}$ measured along a top surface of the Group III-V structure;
the drain electrode is disposed on the Group III-V structure having opposing sides separated by a length $L_{md}$ measured along the top surface of the Group III-V structure;
the inner portion of the gate electrode is disposed on the Group III-V structure having opposing sides separated by a length $L_{mg}$ measured along a top surface of the Group III-V structure; where $L_{mg}$ is less than either $L_{md}$ or $L_{ms}$.

9. The Field Effect Transistor structure recited in claim 7 wherein:
the source electrode is disposed on the Group III-V structure having opposing sides separated by a length $L_{ms}$;
the drain electrode is disposed on the Group III-V structure having opposing sides separated by a length $L_{md}$; and
the inner portion of the gate electrode is disposed between the pair of opposing notches and having a length $L_{mg}$; where $L_{mg}$ is less than either one of $L_{md}$ or $L_{ms}$.

10. A Field Effect Transistor structure, comprising:
a substrate;
a Group IH-V structure disposed on a portion of the substrate, the Group IH-V structure having a notch projecting into a side of the Group III-V structure, the notch projecting from the side toward, and terminating prior to, an active region in the Group III-V structure and, exposing a region of the substrate outside of the Group III-V structure;
a source electrode disposed on a first portion of a surface of the Group III-V structure, the source electrode being in ohmic contact with a source region of the Group III-V structure;
a drain electrode disposed on a second portion of the surface of the Group III-V structure, the drain electrode being in ohmic contact with a drain region of the rGroup III-V structure;
a gate electrode disposed on, and in Schottky contact with, a third portion of the surface of the Group III-V structure, the gate electrode having an inner portion connected to a structure wider than the inner portion, the inner portion being disposed in the active region between the source electrode and the drain electrode and in contact with the active region in the Group III-V structure, the inner portion extending along a direction parallel to the surface of the Group III-V structure towards the notch, a portion of the structure wider than the inner portion being disposed on the region outside of the Group III-V structure exposed by the notch, the portion of the structure wider than the inner portion disposed on the region outside of the Group III-V structure exposed by the notch being narrower than, and spaced from opposing sides of the notch; and
wherein the structure wider than the inner portion comprises a gate pad, a portion of the gate pad being disposed within a portion of the notch and another portion of the gate pad wider than the portion of the gate pad is disposed outside the notch.

11. The Field Effect Transistor structure recited in claim 10 wherein the notch passes through the Group III-V structure from a top surface of the Group III-V structure to the surface of the substrate.

12. The Field Effect Transistor structure recited in claim 10 wherein the inner portion of the gate electrode has a width narrower that the notch.

13. A Field Effect Transistor structure, comprising:
a substrate;
a Group III-V structure on the substrate, the Group III-V structure having a notch projecting into a side of the Group III-V structure, the notch exposing a region of the substrate outside of the Group III-V structure;
a source electrode in ohmic contact with a source region of the Group III-V structure;
a drain electrode in ohmic contact with a drain region of the Group III-V structure;
a gate electrode having an inner portion connected to a structure wider than the inner portion, the inner portion being disposed over, and in Schottky contact with, the Group III-V structure and disposed between the source region and the drain region, the inner portion extending along a direction towards the notch, a portion of the structure wider than the inner portion being disposed on the region of the substrate outside of the Group III-V structure exposed by the notch, the portion of the structure wider than the inner portion disposed on the region of the substrate outside of the Group III-V structure exposed by the notch being narrower than, and spaced from opposing sides of, the notch; and
wherein the structure wider than the inner portion comprises a gate pad, a portion of the gate pad being disposed within a portion of the notch and another portion of the gate pad wider than the portion of the gate pad is disposed outside the notch.

14. The Field Effect Transistor structure recited in claim 13 wherein Group III-V semiconductor structure on the substrate and the portion of the substrate exposed by the notch are different materials.

15. The Field Effect Transistor structure recited in claim 13 wherein the notch is three-dimensional having a length and width along an upper surface of the Group semiconductor structure and a depth perpendicular of the Group semiconductor structure.

16. The Field Effect Transistor structure recited in claim 13 wherein the gate electrode is spaced from the source region and the drain region.

17. The Field Effect Transistor structure recited in claim 13 wherein a carrier control portion of the inner portion of the gate electrode controls a flow of carriers between the source electrode and the drain electrode through an active region closest to the source electrode and the drain electrode; wherein the notch is separated from the active region closest to the source electrode and the drain electrode by a portion of the Group ni-V structure; and wherein the carrier control portion of the inner portion of the gate electrode is in Schottky contact with only a top surface of the Group III-V structure.

18. The Field Effect Transistor structure recited in claim 13 wherein the source region is disposed between opposing sides of the semiconductor structure a length $L_{ms,}$ the drain region is disposed between opposing sides of the semiconductor structure a length $L_{md}$, and the gate electrode is disposed between opposing sides of the semiconductor structure a length $L_{mg}$, where the length $L_{mg}$ is less than the length $L_{md}$ and is also less than the length $L_{ms}$.

19. The Field Effect Transistor structure recited in claim 13 wherein the inner portion of the gate electrode is disposed between a pair of opposing sides of the Group III-V semiconductor mesa structure and wherein one of the pair of opposing sides has the notch therein.

* * * * *